US012764940B2

(12) United States Patent
Yen

(10) Patent No.: US 12,764,940 B2
(45) Date of Patent: Oct. 13, 2026

(54) DYNAMIC RANDOM ACCESS MEMORY WITH BURIED BIT LINE AND METHOD FOR FORMING THE SAME

(71) Applicant: Winbond Electronics Corp., Taichung City (TW)

(72) Inventor: Ying-Chu Yen, Taichung City (TW)

(73) Assignee: WINBOND ELECTRONICS CORP., Taichung City (TW)

( * ) Notice: Subject to any disclaimer, the term of this patent is extended or adjusted under 35 U.S.C. 154(b) by 403 days.

(21) Appl. No.: 18/338,026

(22) Filed: Jun. 20, 2023

(65) Prior Publication Data

US 2024/0015953 A1 Jan. 11, 2024

(30) Foreign Application Priority Data

Jul. 6, 2022 (TW) ................................ 111125276

(51) Int. Cl.
*H10B 12/00* (2023.01)

(52) U.S. Cl.
CPC ......... *H10B 12/482* (2023.02); *H10B 12/038* (2023.02); *H10B 12/053* (2023.02); *H10B 12/34* (2023.02); *H10B 12/485* (2023.02); *H10B 12/488* (2023.02)

(58) Field of Classification Search
CPC .... H10B 12/038; H10B 12/053; H10B 12/34; H10B 12/482; H10B 12/485; H10B 12/488
See application file for complete search history.

(56) References Cited

U.S. PATENT DOCUMENTS

| | | | |
|---|---|---|---|
| 2007/0190766 A1 | 8/2007 | Seo et al. | |
| 2009/0258467 A1 | 10/2009 | Kim | |
| 2012/0217570 A1 | 8/2012 | Kim | |
| 2021/0366911 A1* | 11/2021 | Yen ........................ | H10B 12/05 |

* cited by examiner

*Primary Examiner* — Hoai V Pham

(74) *Attorney, Agent, or Firm* — MUNCY, GEISSLER, OLDS & LOWE, P.C.

(57) ABSTRACT

A method for forming a Dynamic Random Access Memory (DRAM) includes forming an isolation structure in a substrate to define an active region. The method also includes forming a bit line trench in the active region to divide two active pillars. The method also includes forming a buried bit line in the bit line trench. The method also includes forming an insulating material over the bit line in the bit line trench. The top surface of the insulating material is lower than the top surface of the substrate. A trench is formed over the insulating material. The method also includes forming a shallow recess on the sidewalls of each of the active pillars exposed by the trench to make that each of the active pillars has a neck channel region. The method also includes forming a buried word line in the shallow recess.

10 Claims, 11 Drawing Sheets

DYNAMIC RANDOM ACCESS MEMORY WITH BURIED BIT LINE AND METHOD FOR FORMING THE SAME

CROSS REFERENCE TO RELATED APPLICATIONS

This application claims the benefit of Taiwan Patent Application No. 111125276 filed on Jul. 6, 2022, entitled "DYNAMIC RANDOM ACCESS MEMORY AND METHOD FOR FORMING THE SAME" which is hereby incorporated herein by reference.

BACKGROUND OF THE INVENTION

Field of the Invention

The disclosure relates to a semiconductor memory structure and more particularly to a dynamic random access memory (DRAM) with buried bit lines and a method for forming the same.

Description of the Related Art

As semiconductor memory device integration increases, the planar area occupied by each unit memory cell is further reduced. In order to shrink the unit memory cell area in a DRAM, various methods have been proposed to form transistors, bit lines, word lines, and contact structures that are electrically connected to capacitors in a limited area.

However, as the density of DRAM cells increase, sub-threshold leakage, gate-induced drain leakage (GIDL), and the leakage current between the word lines may increase, causing a loss of retention time. In addition, the buried word line process is more difficult to control.

BRIEF SUMMARY OF THE INVENTION

The embodiments of the present disclosure provide a DRAM with a buried bit line and method for forming the same, in order to address the issue of leakage current and enlarge the process window of the buried word lines.

The embodiments of the present disclosure provide a method for forming a DRAM. The method includes forming an isolation structure in a substrate to define an active region. The method also includes forming a bit line trench in the active region to divide two active pillars. The method also includes forming a buried bit line in the bit line trench. The method also includes forming an insulating material over the bit line in the bit line trench, and the top surface of the insulating material is lower than the top surface of the substrate, and the trench is formed over the insulating material. The method also includes forming a shallow recess on the sidewalls of each of the active pillars exposed by the trench to ensure that each of the active pillars has a neck channel region. The method also includes forming a buried word line in the shallow recess.

The embodiments of the present disclosure also provide a DRAM. The DRAM includes a substrate including an active region. The active region includes two active pillars with neck channel regions, and a shallow recess is formed by a surface of each of the neck channel regions. The DRAM also includes a buried bit line between the active pillars, and the top surface of the buried bit line is lower than the top surface of the substrate. The DRAM includes an insulating structure over the buried bit line to separate the active pillars of the active regions. The DRAM includes a plurality of buried word lines, each of the buried word lines is contained in the shallow recess to surround the neck channel region of each of the active pillars, and the insulating structure is between the buried word lines.

The embodiments of the present disclosure provide a DRAM with gate-all-around structure, which may reduce the sub-threshold leakage current caused by short channel effect. In addition, the active pillars of the DRAM of the embodiments of the present disclosure have narrowed neck channel region to form shallow recess for containing the buried word lines. In this way, a portion or all of the buried word lines may be contained in the shallow recess, and then reduce the risk of a short-circuit between buried word lines. In addition, according to the method of forming a DRAM in the present disclosure, an oxide layer is formed and then removed over the sidewalls of the channel region, which may make the corners of the active region rounded, and may reduce the off-leakage current. Furthermore, performing an anneal process may repair the surface of the channel region to improve the gate uniformity and reduce leakage current.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
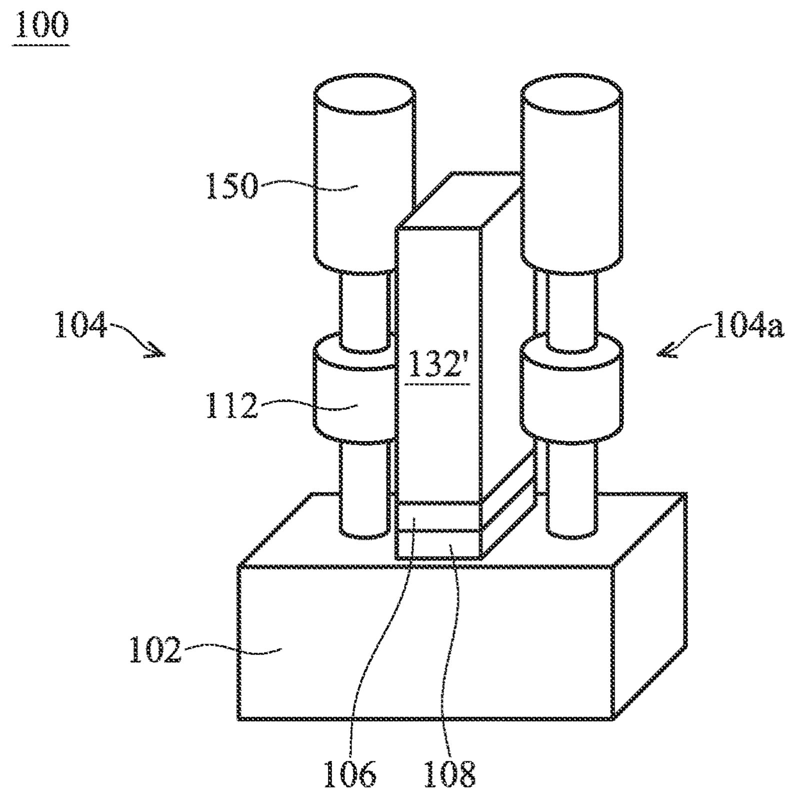
FIG. 1 is a perspective view of a DRAM in accordance with some embodiments.
Figure 2:
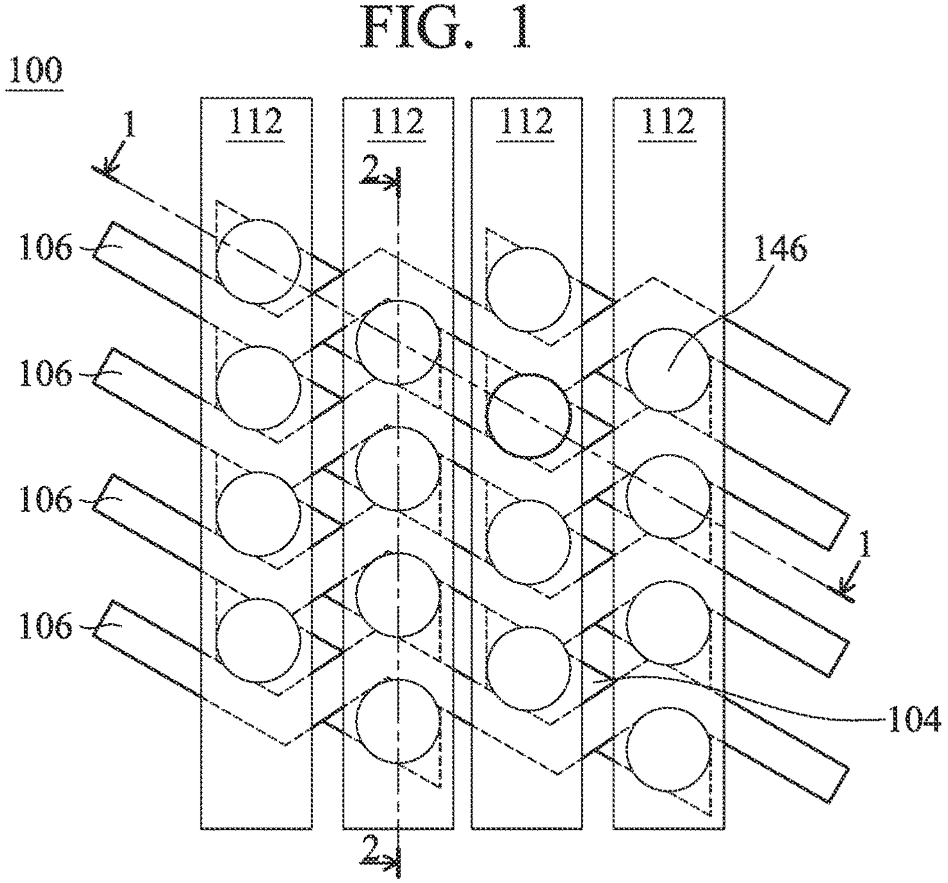
FIG. 2 is a top view of a DRAM in accordance with some embodiments.

With reference to FIGS. 1, 2 and 3A-3Q, the DRAM 100 and the method for forming the same are described in accordance with some embodiments. FIGS. 3A-3I and 3N-3Q show cross-sectional representations of various stages of forming the DRAM 100 as shown in FIG. 2, taken along line 1-1 in FIG. 2. FIGS. 3J-3M show cross-sectional representations of various stages of forming the DRAM 100 as shown in FIG. 2, taken along line 2-2 in FIG. 2.

Figure 3A:
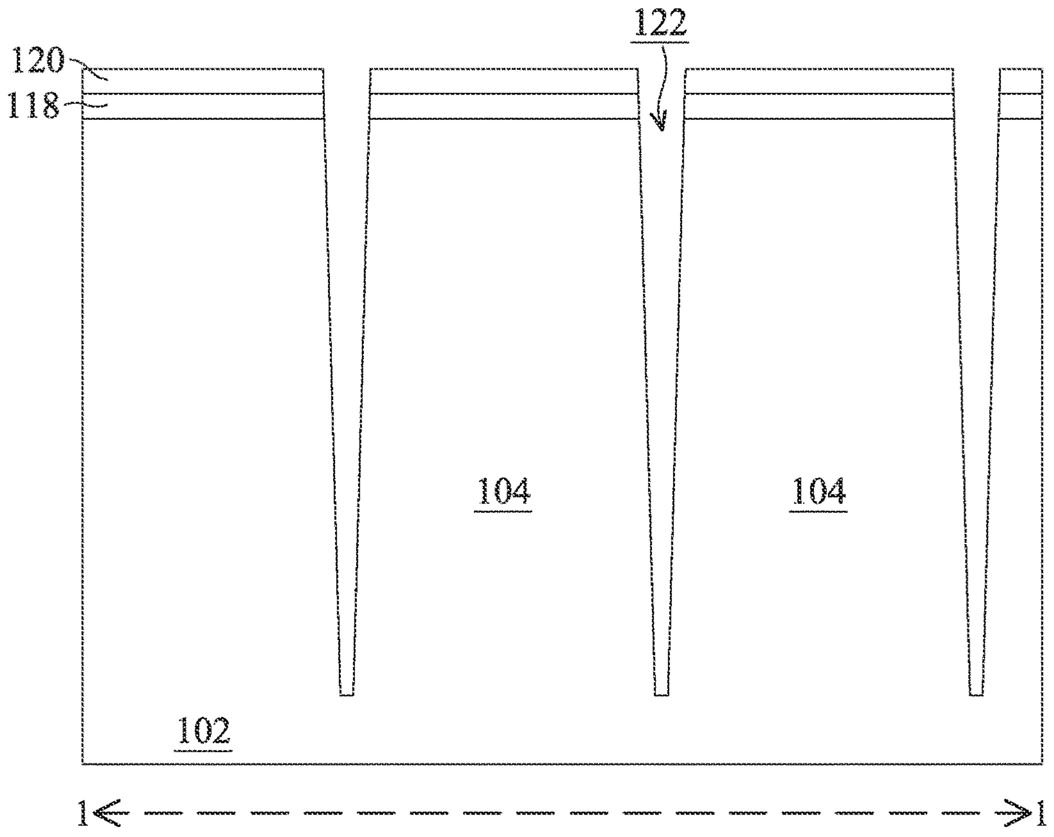
FIGS. 3A-3Q are cross-sectional representations of various stages of forming a DRAM in accordance with some embodiments.
Figure 3B:
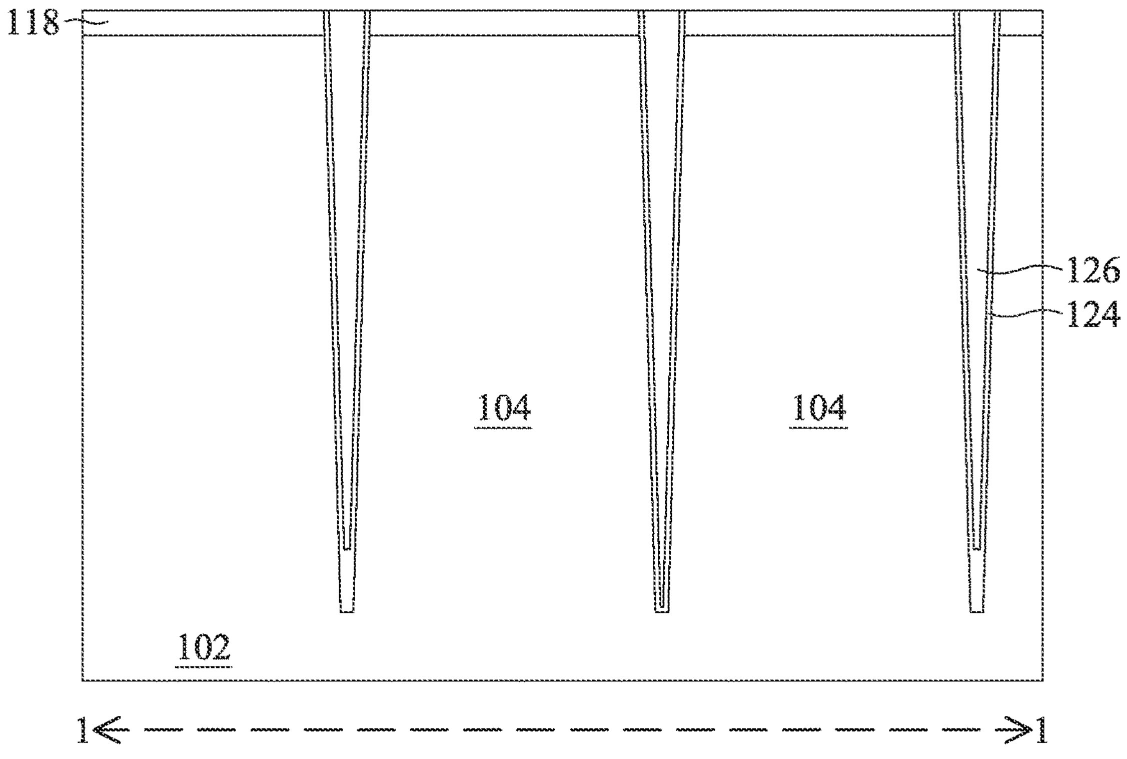
Figure 3C:
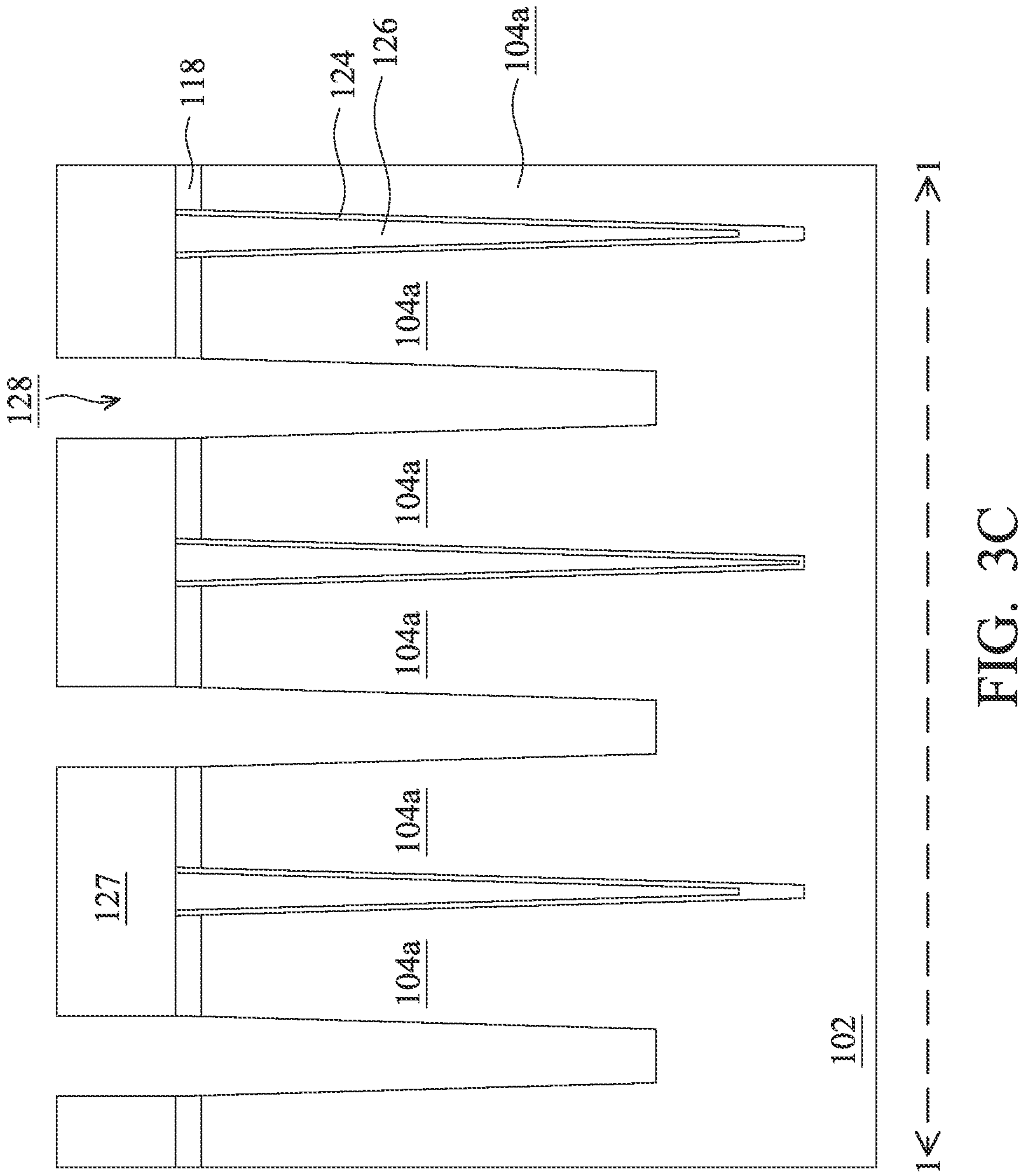
Figure 3D:
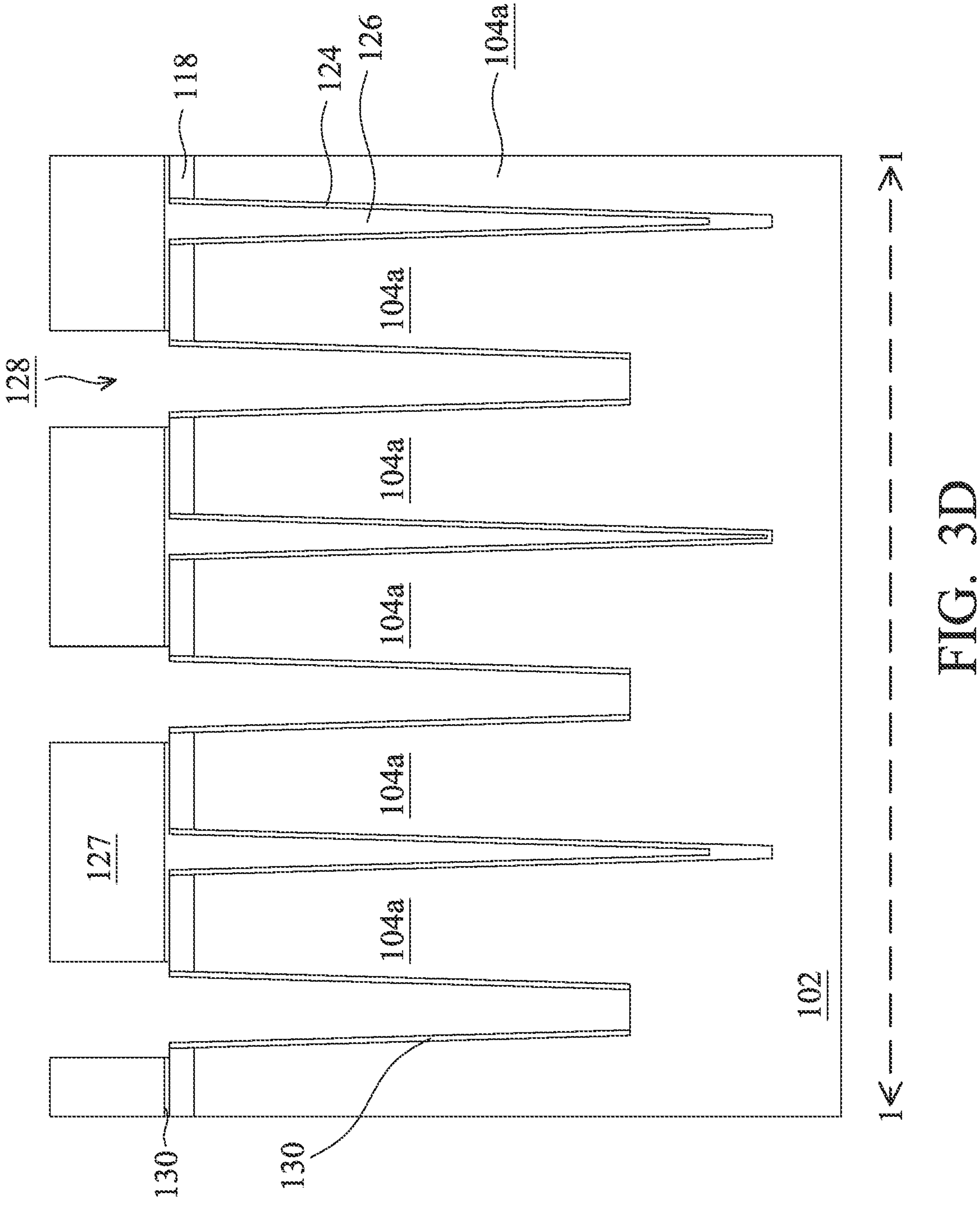
Figure 3E:
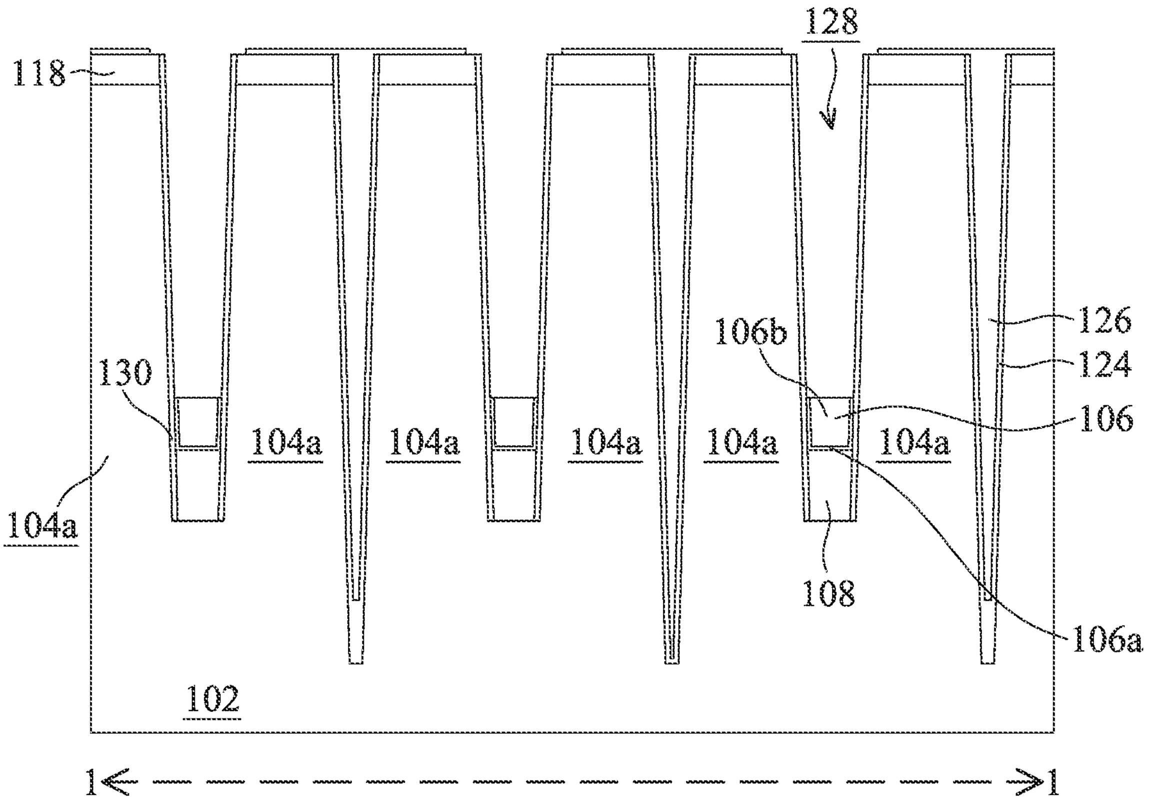
Figure 3F:
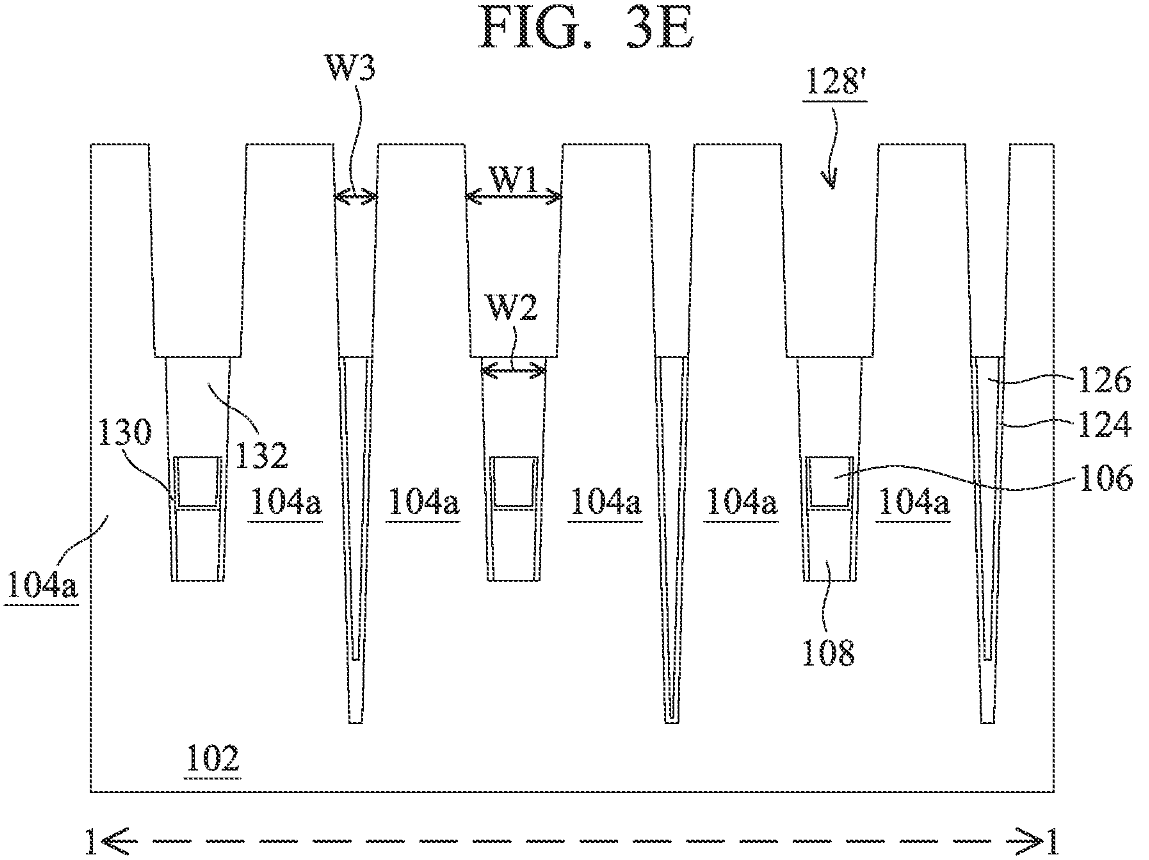
Figure 3G:
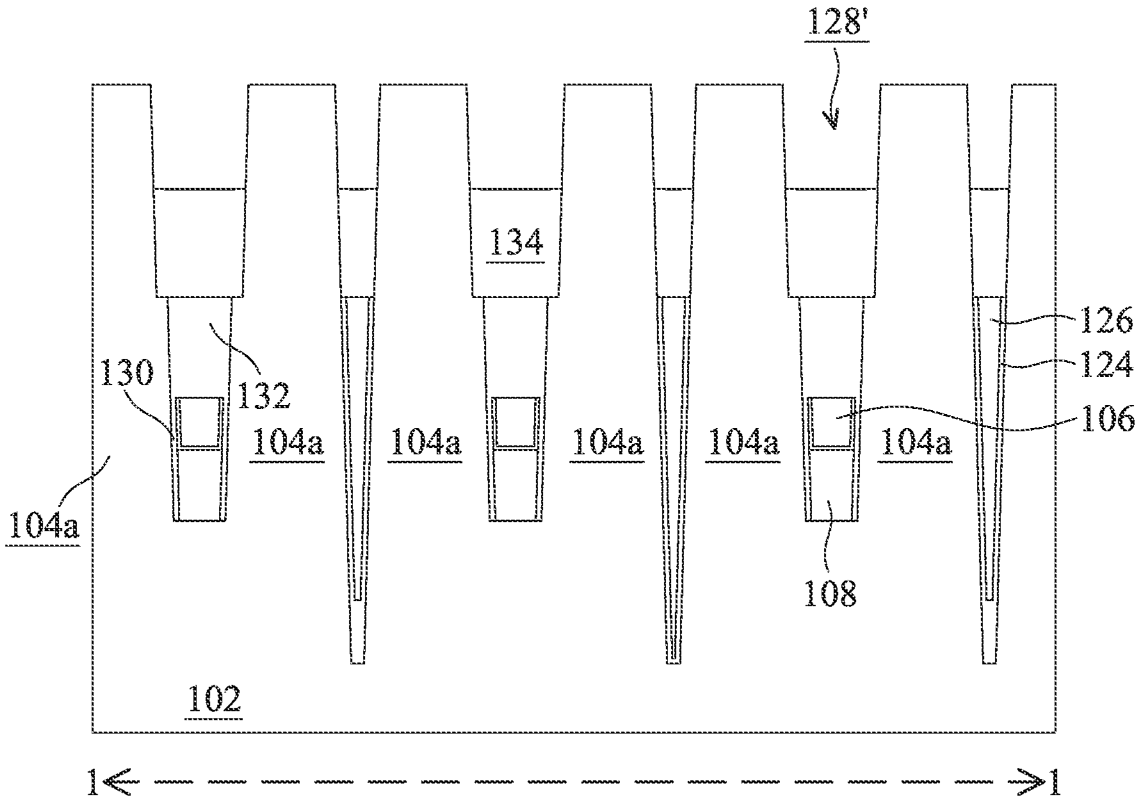
Figure 3H:
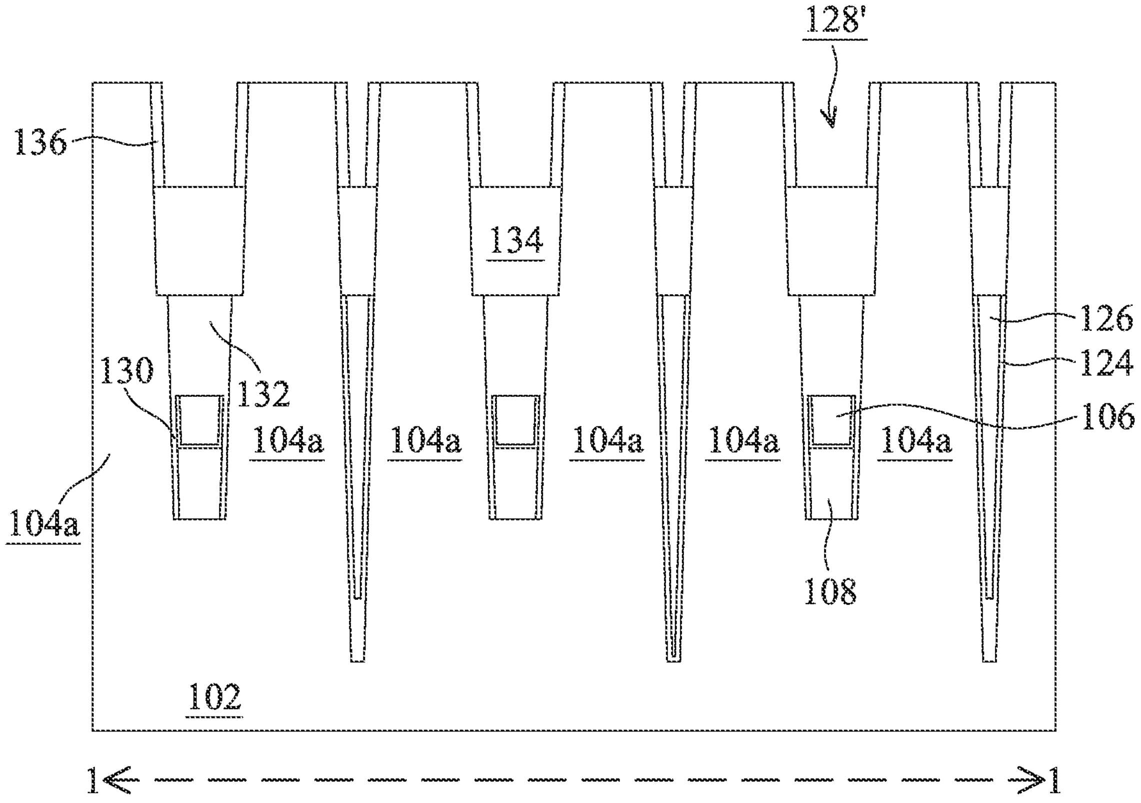
Figure 3I:
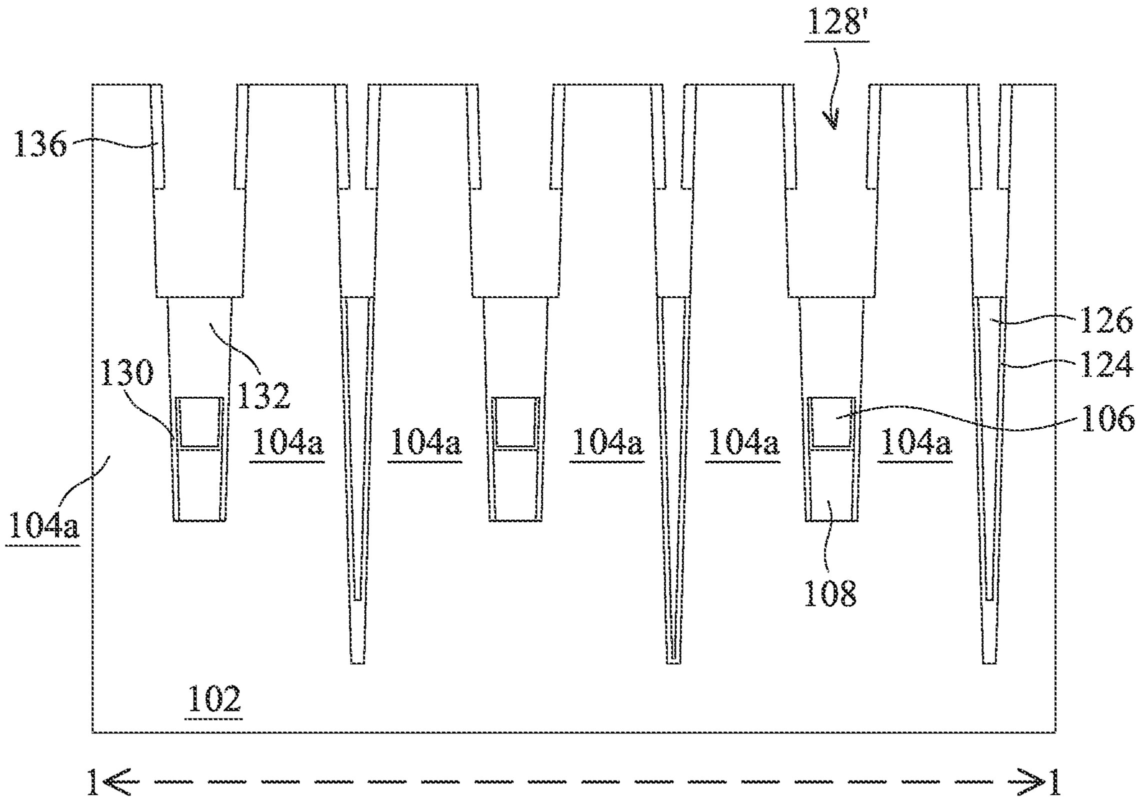
Figure 3J:
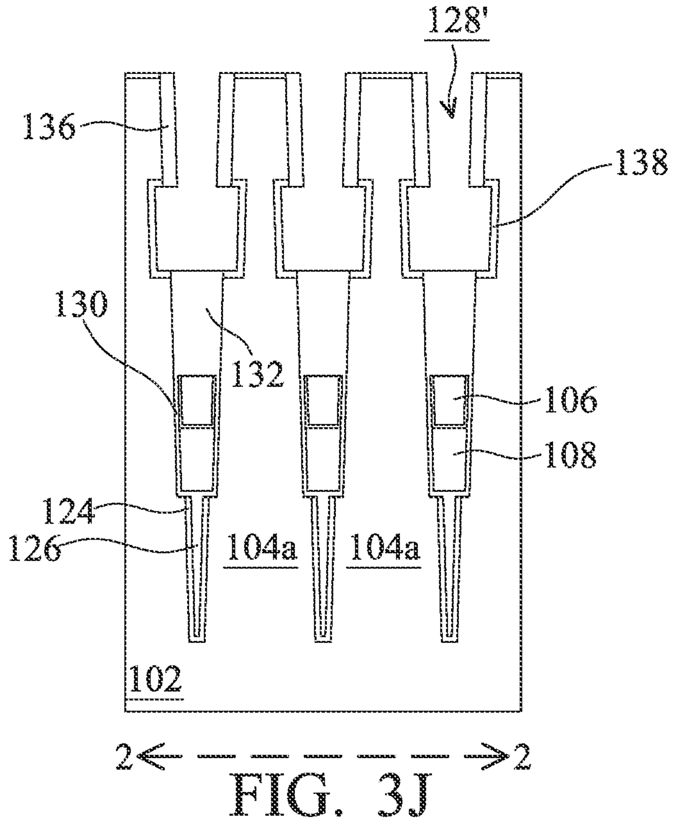
Figure 3K:
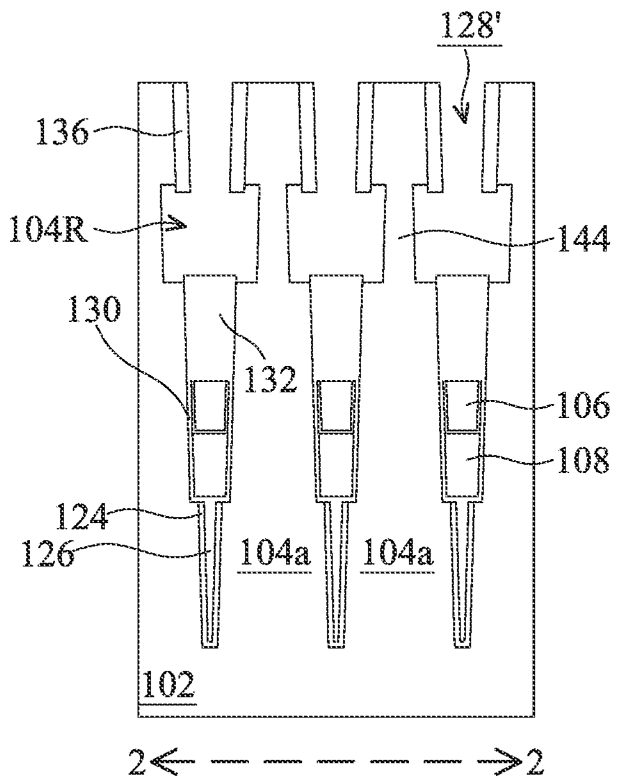
Figure 3L:
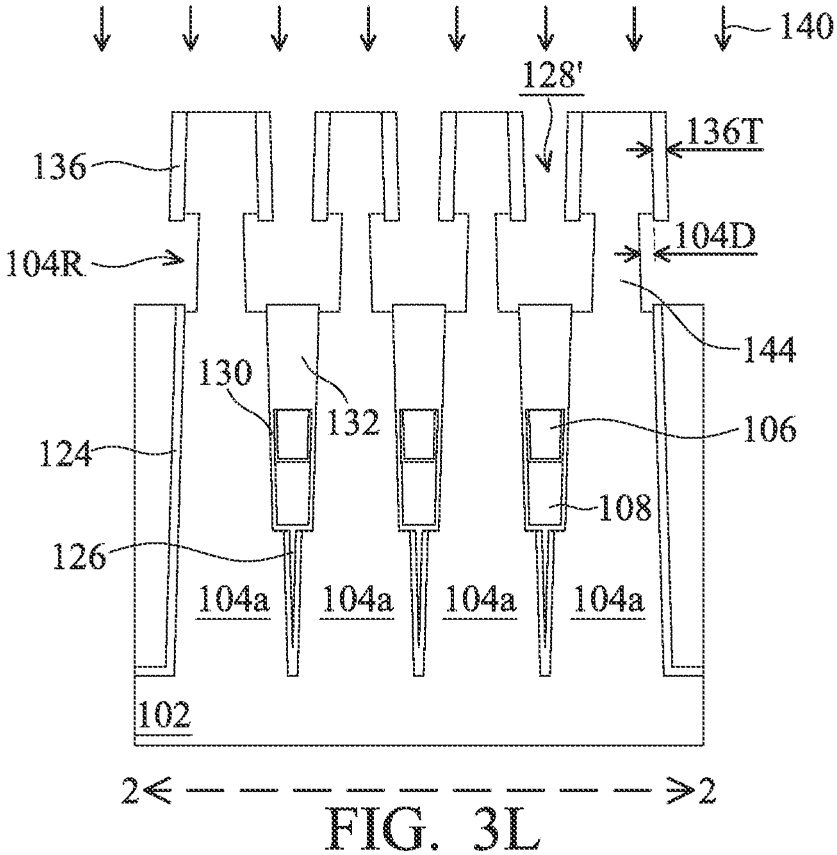
Figure 3M:
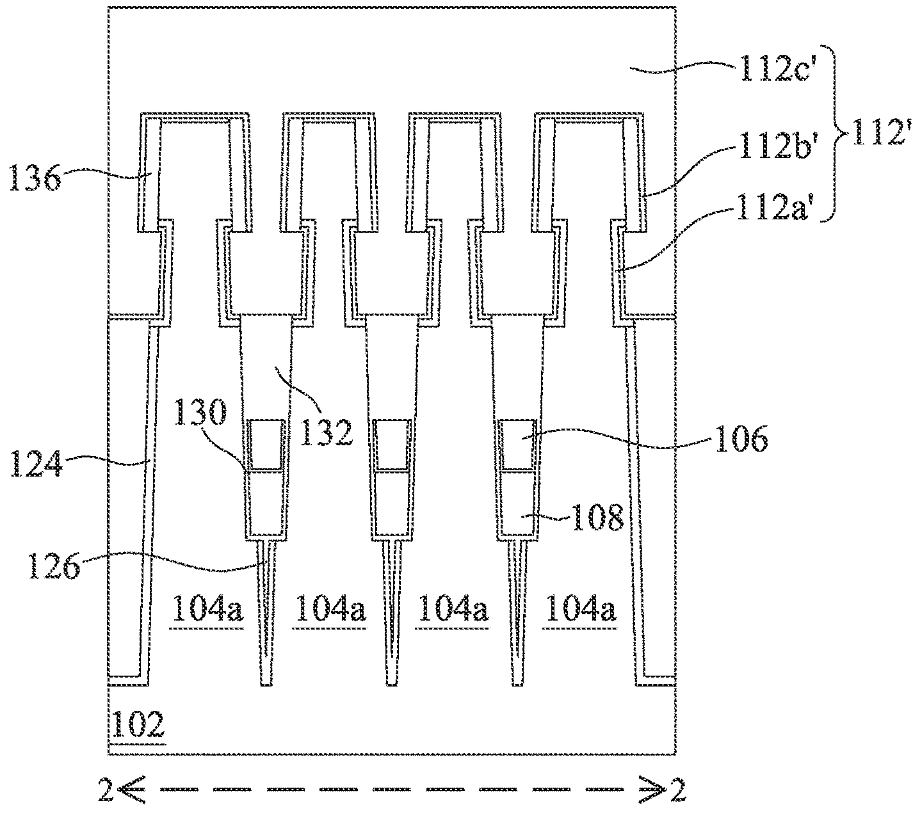
Figure 3N:
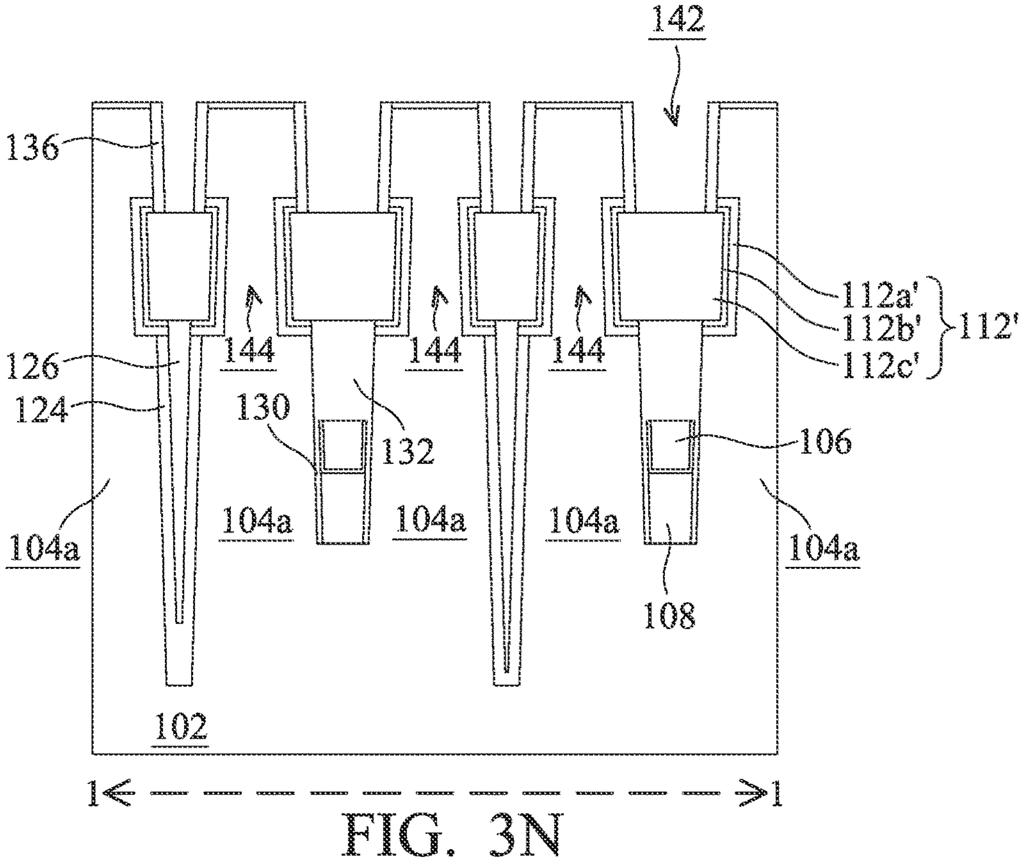
Figure 3O:
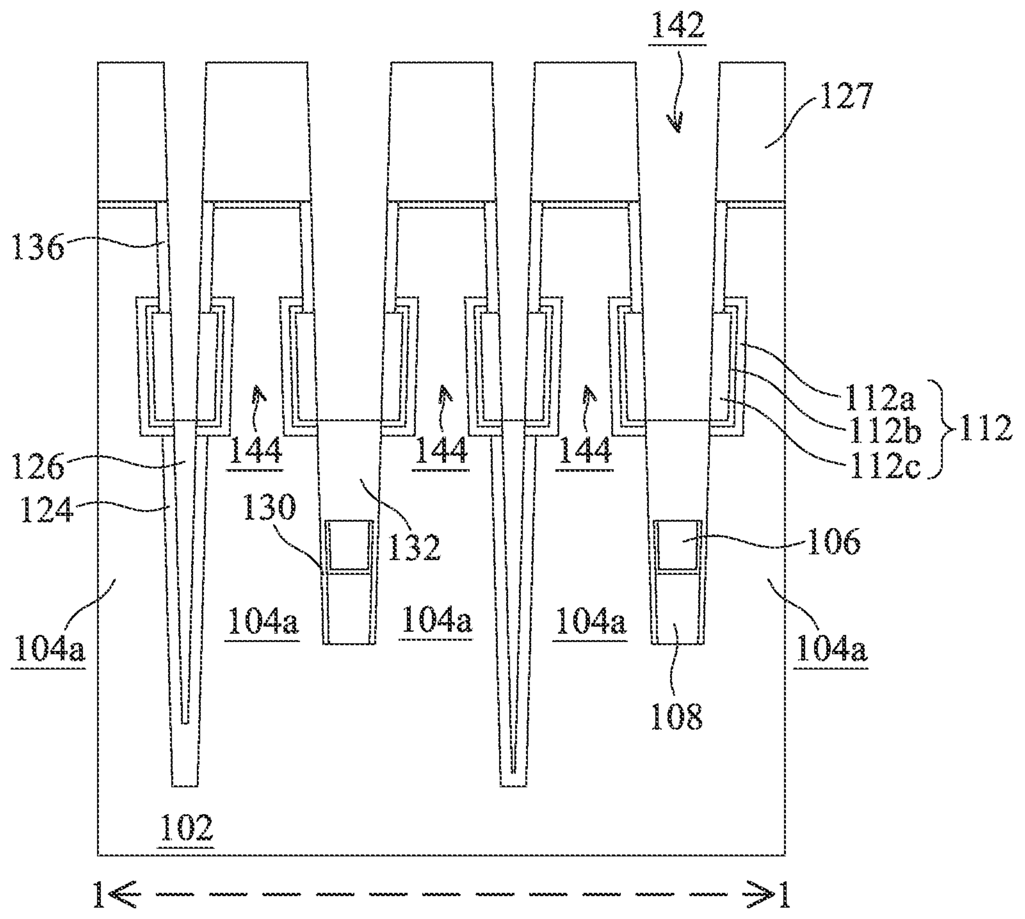
Figure 3P:
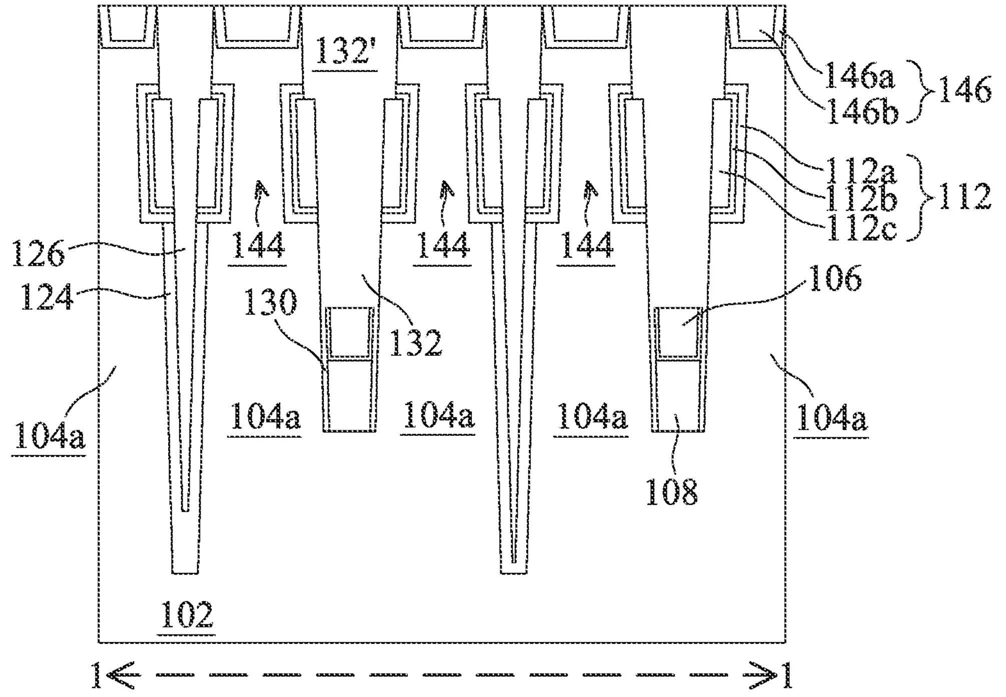
Figure 3Q:
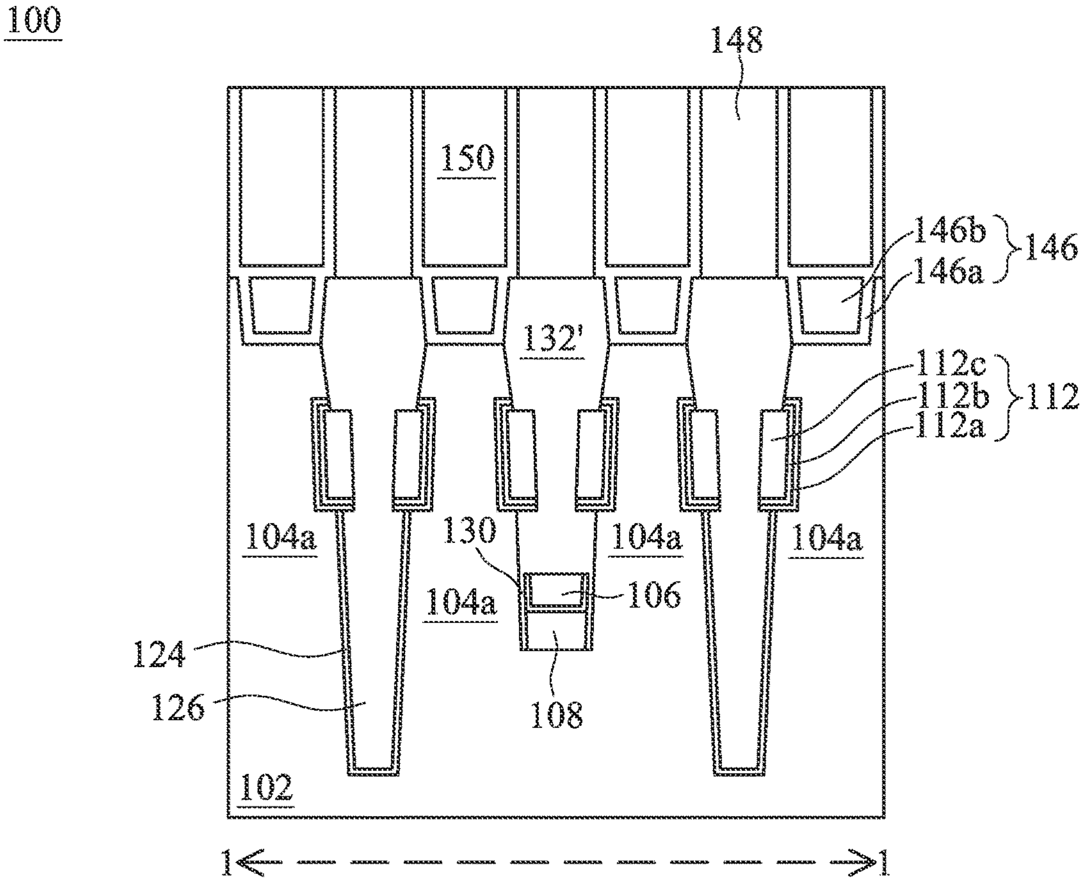

As shown in FIGS. 1, 2 and 3Q, the DRAM 100 of the embodiments of the present disclosure includes a substrate 102 with multiple active regions 104. Each of the active regions 104 includes multiple active pillars 104*a*. The buried bit line 106 is between two adjacent active pillars 104*a*, and electrically connected to the substrate 102 by the underneath bit line contact structure 108. The top surface of the buried bit line 106 is lower than the top surface of the substrate 102. The insulating structure 132' is configured over the buried bit line 106 to separate two adjacent active pillars 104*a* in an active region 104. Each of the buried word lines 112 surrounds multiple active pillars 104*a* arranged in the same column to form surrounding gate structures. Each of the active pillars 104 has source/drain regions respectively located at the upper and lower sides of the buried word lines 112, and has a narrowed neck channel region 144 to form shallow recess 104R for containing the buried word lines 112 (as shown in FIG. 3K). The capacitor 150 may be electrically connected to the active pillar 104*a* by the capacitor contact structure 146. In some embodiments, the capacitor contact structure 146 may be embedded in the top portion of the active pillar 104*a*.

As shown in FIG. 3A, a top layer 118 and a pad layer 120 are sequentially formed over the substrate 102, and multiple isolation trenches 122 are formed by a patterning process such as a photolithography and an etching process to define multiple active regions 104 in the substrate 102. The substrate 102 may be a semiconductor substrate, which may include elementary semiconductor such as Si and Ge, etc.; compound semiconductors such as GaN, SiC, GaAs, GaP, InP, InAs, InSb, etc.; alloy semiconductors such as SiGe, GaAsP, AlInAs, AlGaAs, GaInAs, GaInP, GaInAsP, or a combination thereof. In addition, the substrate 102 may also be a semiconductor on insulator (SOI). The substrate 102 may have an N-type or a P-type conductivity type. The N-type dopant may include P, As, N, Sb ions, or a combination thereof. The P-type dopant may include B, Ga, Al, In, BF3+ ions, or a combination thereof.

The top layer 118 may be a buffer layer between the substrate 102 and the pad layer 120. The pad layer 120 may be an etch stop layer or an isolation layer for subsequently process. In some embodiments, the top layer 118 may be oxide such as silicon oxide. The pad layer 120 may be SiN, SiCN, SiOC, SiOCN, or a combination thereof. Next, as shown in FIG. 3B, a liner layer 124 is conformally formed on the surface of the isolation trench 122. An isolation material is formed over the liner layer 124 to fill the isolation trench 122, and the isolation material is planarized to expose the top surface of the pad layer 120, and the isolation structure 126 is thereby formed. Afterwards, the pad layer 120 is removed. The liner layer 124 may protect the active region 104 to prevent it from damage in the subsequently process (such as in the annealing or the etching process). In some embodiments, the liner layer 124 is made of oxides such as silicon oxide.

The isolation material includes silicon nitride, silicon oxide, SiCN, SiOC, SiOCN, other dielectric material, or a combination thereof.

Next, as shown in FIG. 3C, the substrate 102 is etched with the patterned photoresist 127 as a mask to form multiple bit line trenches 128 in the substrate 102, and the active region 104 is divided to multiple active pillars 104*a*. Each active pillar 104*a* is between the bit line trench 128 and the isolation trench 122.

Next, as shown in FIG. 3D, a barrier layer 130 is conformally formed over the surface of the bit line trench 128, the top layer 118, and the isolation structure 126. In some embodiments, the barrier layer 130 is a dielectric material. In some embodiments, the barrier layer 130 is made of nitride such as SiN, SiCN, SiOC, SiOCN. SiN may be a barrier layer of the metal such as tungsten in the subsequently formed buried bit lines. In some embodiments, the barrier layer 130 and the isolation structure 126 are made of the same material. Next, the barrier layer 130 over the bottom surface of the bit line trench 128 is removed by the patterning process, in order to expose the substrate 102 at the bottom portion of the bit line trench 128 and a portion of the top layer 118. The barrier layer 130 over the bottom surface of the bit line trench 128 is removed by a dry etching process (such as a reactive ion etching (RIE), anisotropic plasma etching, or a combination thereof). In the embodiments of the present disclosure, when removing the barrier layer 130 over the bottom surface of the bit line trench 128, a portion of the barrier layer 130 over the top layer 118 is also removed.

Next, as shown in FIG. 3E, a bit line contact structure 108 is formed at the bottom of the bit line trench 128, and a buried bit line 106 is formed over the bit line contact structure 108, and the top surface of the buried bit line 106 is lower than the top surface of the substrate 102. The bit line contact structure 108 includes semiconductor material, such as polysilicon. Polysilicon and Ti in the subsequently formed buried bit lines may form titanium silicide in order to reduce resistance. The buried bit line 106 may be electrically connected to the active region of the substrate 102 by the bit line contact structure 108. In some embodiments, the buried bit line 106 includes a barrier layer 106*a* and a conductive layer 106*b*. The barrier layer 106*a* may prevent the conductive layer 106*b* from diffusing to adjacent active pillars 104*a*. In some embodiments, the material of the barrier layer 106*a* may be Ti, TiN, Ta, TaN, W, WN, or a combination thereof. The conductive layer 106*b* includes metal material (such as tungsten, aluminum, or copper), metal alloy, or a combination thereof.

Afterwards, as shown in FIG. 3F, an insulating material 132 is formed over the buried bit line 106 to fill the bit line trench 128. Next, the insulating material 132 is etched back to a desired height to make the top surface of the insulating material 132 lower than the top surface of the substrate 102. Meanwhile, the isolation structure 126 is etched back, and the substrate 102 surround the removed insulating material 132 is laterally etched. Therefore, after etching back the insulating material 132, the width W1 of the trench 128' over the insulating material 132 is greater than the width W2 of the insulating material 132 in the bit line trench 128. In some embodiments, the insulating material 132 and the isolation structure 126 may include the same material. In the embodiments of the present disclosure, the insulating material 132 is silicon nitride. The position of the channel region of the DRAM 100 may be determined by the height of the insulating material 132. In addition, since the width W1 of the trench 128' over the bit line 106 is greater than the width W3 of the trench 128' over the isolation structure 126, the trench 128' over the bit line 106 is laterally etched more than the trench 128' over the isolation structure 126. In some embodiments, the etching back process includes the dry etching process.

Next, as shown in FIG. 3G, a sacrificial layer 134 is formed over the insulating material 132 to fill up the trench 128'. Afterwards, the sacrificial layer 134 is etched back to a desired height to make the top surface of the sacrificial layer 134 lower than the top surface of the substrate 102. The position of the channel region of the DRAM 100 may be determined by the height of the sacrificial layer 134. The material of the sacrificial layer 134 is different from the insulating material 132, in order to provide etching selectivity for subsequently etching process. In some embodiments, the sacrificial layer 134 is made of oxides such as silicon oxide.

Next, as shown in FIG. 3H, a dielectric spacer 136 is formed over sidewalls of the top portions of the active pillars 104*a*. The top portion of the active pillar 104*a* is higher than the top surface of the sacrificial layer 134. In some embodiments, the dielectric spacer 136 may have the same material as the insulating material 132. For example, the dielectric spacer 136 may include nitrides such as SiN, SiCN, SiOC, SiOCN.

Next, as shown in FIG. 3I, the sacrificial layer 134 is removed. In some embodiments, the sacrificial layer 134 may be removed by a wet etching process such as using dHF. After removing the sacrificial layer 134, the region between the dielectric spacer 136 and the insulating material 132 in the active pillar 104*a* is the predetermined position of the channel region.

Next, as shown in FIG. 3J, an oxide layer 138 is formed over the exposed surface of the active pillars 104*a*. In other words, the oxide layer 138 is formed on the surface of the active pillars 104*a* between the dielectric spacer 136 and the insulating material 132 and the top surface of the active pillars 104*a*. In some embodiments, the oxide layer 138 is formed by a thermal oxidation process such as a rapid thermal processing (RTP) or an in-situ steam generation (ISSG).

Next, as shown in FIG. 3K, the oxide layer 138 is removed to enlarge the bottom width of the trench 128'. In this way, the active pillars 104*a* has a narrowed neck channel region 144, and the surface of the neck channel region 144 forms a shallow recess 104R for containing a buried word line, thereby reducing the resistance of the subsequently formed buried word line. Meanwhile, this may prevent short-circuit issue caused by the distance between adjacent subsequently formed buried word lines being too short.

Figure 4:
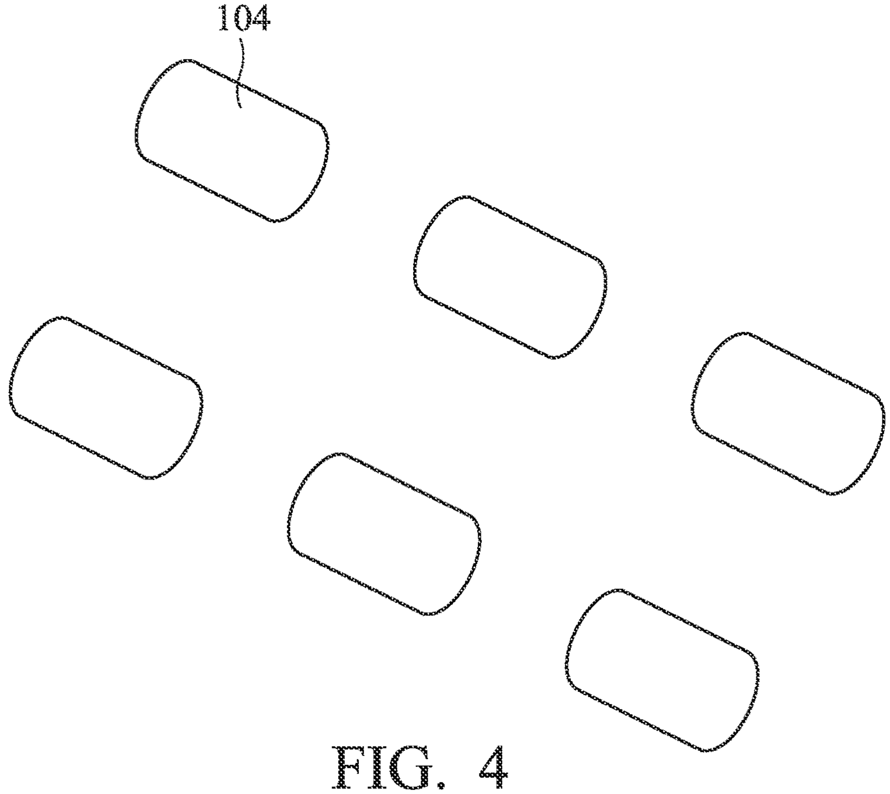
FIG. 4 is a top view of an active region in accordance with some other embodiments.

As shown in FIG. 4, after removing the oxide layer 138, the active region 104 has rounded corners. In this way, the leakage current may be further reduced without affecting the area of subsequently formed capacitor contact structures.

In some embodiments, the oxide layer 138 formed by RTP or ISSG is no thicker than the dielectric spacer 136. The thickness of the oxide layer 138 is in a range of about 3 nm to about 5 nm. In this way, it may be easier to form an active region 104 with rounded corners, and it may facilitate the removal of the oxide layer 138.

Later, as shown in FIG. 3L, an anneal process 140 is performed to repair the exposed surface of the active pillars 104*a*, by which the gate uniformity is further improved and the leakage current may be reduced. In some embodiments, the annealing process is a hydrogen annealing process. The annealing process 140 has a temperature in a range of about 650° C. to about 800° C. The annealing process 140 takes about 30 seconds to about 60 seconds. In this way, the dopant diffusion in the active pillars 104*a* may be limited. In some embodiments, after the annealing process 140, the depth 104D of the shallow recess 104R is no greater than the thickness 136T of the dielectric spacer 136. In this way, it may be easier for the buried word lines 112 to be embedded in the shallow recess 104R, preventing short-circuits between the buried word lines 112.

Next, as shown in FIG. 3M, a word line material 112' is formed in the trench 128'. In some embodiments, the word line material 112' may include the gate dielectric material 112*a'*, the barrier material 112*b'*, and the gate electrode material 112*c'* subsequently formed in the trench 128'. Among them, the gate dielectric material 112*a'* is over the exposed surface of the active pillars 104*a*, and then the barrier material 112*b'* is conformally and blanketly formed, and the gate electrode material 112*c'* is filled in the trench 128'. In the embodiments of the present disclosure, the gate dielectric material 112*a'* is formed over the surface of the shallow recess 104R and the top surface of the active pillar 104*a*.

In some embodiments, the gate dielectric material 112*a'* may include silicon oxide, silicon nitride, or silicon oxynitride, high dielectric constant (high-k) (i.e., dielectric constant greater than 3.9) dielectric material such as $HfO_2$, LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTiO, LaSiO, AlSiO, $Al_2O_3$, or a combination thereof. In the embodiments of the present disclosure, the gate dielectric material 112*a'* is formed by a thermal oxidation process. The material of the barrier material 112*b'* and the gate electrode material 112*c'* may be similar or the same as the material of the barrier layer 106*a* and the conductive layer 106*b*, and is not repeated herein.

Next, as shown in FIG. 3N, the word line material 112' is etched back, to make the top surface of the etched back word line material 112' lower than the top surface of the substrate 102, and an opening 142 is formed over the word line material 112'. In some embodiments, the top surface of the etched back word line material 112' is substantially level with the bottom surface of the dielectric spacers 136. In some embodiments, the etching back amount of the word line material 112' is controlled by time. In the embodiments of the present disclosure, the barrier material 112*b'* and the gate electrode material 112*c'* of the word line material 112' are etched back, and the gate dielectric material 112*a'* is not etched back.

Next, as shown in FIG. 3O, the word line material 112' is patterned by the photoresist 127, and the opening 142 is deepened to exposed the beneath isolation structure 126 and the insulating material 132, and the sidewalls of the gate electrode material 112*c'* are exposed. Therefore, the buried word line 112 is formed surrounding the neck channel region 144 of the active pillars 104*a*. In addition, the source/drain regions of the active pillars 104*a* are above or below the channel region 144. The buried word line 122 surrounding the active pillars 104*a* may be referred as a gate-all-around structure. In this way, the contact area of the buried word line 112 and the channel region 144 has increased, and the sub-threshold leakage current caused by the short-channel effect has decreased. According to the embodiments of the present disclosure, a portion of the buried word lines 112 is embedded in the active pillars 104*a*, which may prevent short-circuits between adjacent buried word lines 112.

In some embodiments, the gate dielectric layer 112*a* of the buried word line 112 is over the sidewalls of the active pillars 104*a*. The barrier layer 112*b* of the buried word line 112 is formed over the gate dielectric layer 112*a*. The gate electrode layer 112*c* of the buried word line 112 is formed over the barrier layer 112*b*.

Next, as shown in FIG. 3P, the opening 142 is filled with insulating material 132, and a planarization process such as a chemical mechanical polishing (CMP) process is performed to remove a portion of the insulating material 132 to expose the top surface of the active pillars 104*a*, so as to form the insulating structure 132'. In some embodiments, the insulating structure 132' is in direct contact with the gate electrode layer 112*c*. In addition, the gate electrode layer 112*c* is embedded in the recess formed by the surface of the barrier layer 112*b*.

Next, a capacitor contact structure 146 is formed over the active pillars 104*a*. The steps of forming the capacitor 146 includes forming a recess for containing the capacitor contact structure 146 at the top portion of the active pillar 104*a*, and then optionally forming a metal semiconductor compound layer at the top portion of the active pillar 104*a* (not shown). The metal semiconductor compound layer may reduce the resistance between the source/drain region of the active pillar 104*a* and the subsequently formed capacitor contact structure 146. The metal semiconductor compound layer may include $TiSi_2$, NiSi, CoSi, or a combination thereof.

Afterwards, the capacitor contact structure 146 is formed in the recess of the top portion of the active pillars 104*a*. In some embodiments, the capacitor contact structure 146 includes a barrier layer 146*a* and a conductive material 146*b*. The bottom surface of the capacitor contact structure 146 is lower than the top surface of the insulating structure 132'. In some embodiments, the capacitor contact structure 146 is over the active pillar 104*a*, and is in direct contact with the source/drain region of the active pillar 104*a*.

The material and the process of forming the barrier layer 146*a* and the conductive material 146*b* of the capacitor contact structure 146 may be similar or the same as the process of forming the barrier layer 106*a* and the conductive layer 106*b* of the bit line 106, and is not repeated herein. By using the method illustrated in FIG. 3P, the capacitor contact structure 146 may be self-aligned formed over the active pillars 104*a*, and does not need an extra mask and patterning process.

Next, as shown in FIG. 3Q, a dielectric layer 148 is blanketly formed over insulating structure 132'. Later, a trench is formed in the dielectric layer 148 by a patterning process such as a lithography and etching process (not shown). In some embodiments, the trench in the dielectric layer 148 is aligned with the capacitor contact structure 146.

Next, a capacitor 150 is formed in the trench in the dielectric layer 148. Therefore, the capacitor 150 is formed over the capacitor contact structure 146. The capacitor 150 may include the bottom electrode, the top electrode, and the dielectric sandwiched between the bottom electrode and the top electrode (not shown). The bottom electrode and the top electrode may include TiN, TaN, TiAlN, TiW, WN, Ti, Au, Ta, Ag, Cu, AlCu, Pt, W, Ru, Al, Ni, metal nitrides, other suitable electrode materials, or a combination thereof. The dielectric may include high dielectric constant dielectric material such as $HfO_2$, LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTiO, LaSiO, AlSiO, $Al_2O_3$, or a combination thereof.

In some embodiments, as shown in FIG. 2, the bit line 106 has a bending pattern in the top view. In some embodiments, a portion of the bit line 106 is parallel to the active region 104 in the top view. In some embodiments, a portion of the bit line 106 overlaps the active region 104 in the top view, and the capacitor contact structures 146 are at opposite sides of the bit line 106. The bending bit line 106 may increase the area of the active region 104, and therefore the on-current may be increased. The bending bit line 106 may also increase the distance between the buried word lines 112, and the process window of the buried word line 112 may be increased.

As mentioned above, by separating the active pillars by a buried bit line, the leakage current between the buried word lines may be decreased. The Gate-all-around (GAA) structure may increase the contact area of the buried word line and the channel region, and decrease the sub-threshold leakage current caused by the short channel effect. Lowering the leakage current may improve the loss of retention time. By forming the removing the oxide layer over the channel region, the active region may have rounded corners, and the leakage current may be reduced when keeping the area of the capacitor contact structure. Furthermore, the annealing process may repair the surface of the channel region, in order to improve gate uniformity and to reduce the leakage current. Bending bit lines may increase the on-current and the process window of the buried word lines. Therefore, the present disclosure provides a green technology by reducing power consumption of the DRAM. Also, according to the present disclosure, it is easier to realize the consumers' demand for miniaturization of the DRAM. Accordingly, the present disclosure may be used on automotive electronics, such as Advanced Driver Assistance Systems (ADAS), Instrument Clusters, Infotainment. The present disclosure may be used on Industrial applications, such as aerospace, medical, safety equipment, health & fitness, industrial controls, instrumentation, security, transportation, telecommunications, PoS machines, human machine interface, programmable logic controller, smart meter, and industrial networking. The present disclosure may be used on communication and networking devices such as STB, switches, routers, passive optical networks, xDSL, wireless access point, cable modem, power line communications M2M, mobile phones, base stations, DECT phones, and many other new communication products. The present disclosure may be used on desktops, notebooks, servers, gaming notebooks, ultrabooks, tablets, convertibles, HDD, and SSD. The present disclosure may be used on space constrained applications including Wearable, MP3 players, smart watches, games, digital radio, toys, cameras, digital photo album, GPS, Bluetooth and WiFi modules. The present disclosure may be used on television, display and home electronics.

What is claimed is:

1. A DRAM, comprising:

a substrate comprising an active region, wherein the active region comprises two active pillars with neck channel regions, and a shallow recess is formed on surfaces of each of the neck channel regions;

a buried bit line between the active pillars, and a top surface of the buried bit line is lower than a top surface of the substrate;

an insulating structure over the buried bit line to separate the active pillars of the active regions an isolation structure to define the active region, and the isolation structure has a width less than a width of the insulating structure; and a plurality of buried word lines, wherein each of the buried word lines is contained in the shallow recess to surround the neck channel region of each of the active pillars, and the insulating structure is between the buried word lines, wherein the shallow recess is a concave recess defined in a sidewall of the neck channel region.

2. The DRAM as claimed in claim 1, wherein the buried word line comprises:

a gate dielectric layer formed on surfaces of the neck channel region of each of the active pillars;

a barrier layer formed over the gate dielectric layer; and a gate electrode layer formed over the barrier layer.

3. The DRAM as claimed in claim 2, wherein the gate electrode layer is embedded in a recess formed on a surface of the barrier layer.

4. The DRAM as claimed in claim 2, wherein a sidewall of the gate electrode layer interfaces with the insulating structure.

5. The DRAM as claimed in claim 2, wherein distinct portions of a top surface of the gate electrode layer are respectively in direct contact with the insulating structure and the barrier layer.

6. The DRAM as claimed in claim 2, wherein the gate dielectric layer has a U-shaped cross-sectional profile.

7. The DRAM as claimed in claim 2, wherein, in a cross-sectional view, the barrier layers located on opposite sides of the neck channel region each have a U-shaped profile, and openings of the U-shaped profiles face away from each other.

8. The DRAM as claimed in claim 1, further comprising:

a bit line contact structure disposed between the buried bit line and the substrate;

a capacitor contact structure formed over top portions of each of the active pillars; and a capacitor formed over the capacitor contact structure.

9. The DRAM as claimed in claim 1, wherein the buried bit line has a bending pattern, and a portion of the buried bit line is parallel to the active region, and another portion of the buried bit line overlaps the active region, such that the capacitor contact structure is on opposite sides of the other portion of the buried bit line.

10. The DRAM as claimed in claim 1, wherein the active region has a rounded corner.

* * * * *